United States Patent [19]

Nowak et al.

[11] Patent Number: 5,245,287
[45] Date of Patent: Sep. 14, 1993

[54] NUCLEAR MAGNETIC RESONANCE TOMOGRAPHY APPARATUS HAVING A RESONANT CIRCUIT FOR GENERATING GRADIENT FIELDS

[75] Inventors: Stefan Nowak, Braeuningshof/Erlangen; Franz Schmitt, Erlangen, both of Fed. Rep. of Germany

[73] Assignee: Siemens Aktiengesellschaft, Munich

[21] Appl. No.: 924,976

[22] Filed: Aug. 5, 1992

[30] Foreign Application Priority Data

Aug. 20, 1991 [DE] Fed. Rep. of Germany ....... 4127529

[51] Int. Cl.$^5$ ................................................ G01V 3/00
[52] U.S. Cl. ...................................... 324/322; 324/318
[58] Field of Search ............... 324/322, 318, 307, 309; 128/653.5

[56] References Cited

U.S. PATENT DOCUMENTS

| | | | |
|---|---|---|---|
| 4,668,904 | 5/1987 | Kupiainen | 323/350 |
| 4,733,342 | 3/1988 | Mueller et al. | 324/322 |
| 4,961,054 | 10/1990 | Park et al. | 324/322 |
| 5,017,871 | 5/1991 | Mueller et al. | 324/318 |
| 5,063,349 | 11/1991 | Roemer et al. | 324/322 |

FOREIGN PATENT DOCUMENTS

| | | |
|---|---|---|
| 0076054 | 9/1982 | European Pat. Off. |
| 0227411 | 7/1987 | European Pat. Off. |
| 0429715 | 6/1991 | European Pat. Off. |

Primary Examiner—Louis Arana
Attorney, Agent, or Firm—Hill, Steadman & Simpson

[57] ABSTRACT

A nuclear magnetic resonance tomography apparatus has at least one gradient coil interconnected with a capacitor to form a resonant circuit. Before the beginning of each read-out sequence, the capacitor is charged to a higher voltage than would be necessary to produce a pure sine oscillation during the read-out sequence. The rise time of the gradient pulse thus produced is less than one-fourth of the duration of the sinusoidal oscillation before the zero-axis crossing, and the decay time is less than one-fourth of the duration of the sinusoidal oscillation after the zero-axis crossing. Additionally, a constant part of each gradient pulse is non-resonantly generated by a gradient amplifier. Only the steep parts of the oscillation of the resonant circuit are used for the rising and trailing edges, whereas the flattened part of the sine oscillation is cut off. The rising and trailing edges can thus be noticeably shortened, so that a greater range for the constant gradient value, which can be equidistantly sampled in the k-space is available for the signal evaluation.

4 Claims, 8 Drawing Sheets

NUCLEAR MAGNETIC RESONANCE TOMOGRAPHY APPARATUS HAVING A RESONANT CIRCUIT FOR GENERATING GRADIENT FIELDS

BACKGROUND OF THE INVENTION

1. Field of the Invention

The present invention is directed to a nuclear magnetic resonance tomography apparatus of the type wherein at least one gradient coil is connected with at least one capacitor to form a resonant circuit, which is connected to a gradient amplifier that is driven according to a predetermined time function.

2. Description of the Prior Art

Nuclear magnetic resonance tomography systems are known which are operated with a pulse sequence, with a read-out sequence occurring after each excitation per scan. At least two gradients disposed perpendicularly relative to each other are generated for location coding, with the resulting signals being digitized and written in the k-space in a raw data matrix. An image is then acquired from the raw data matrix by two-dimensional Fourier transformation. It is known to connect at least one of the gradient coils with at least one capacitor to form a resonant circuit. The resonant circuit is connected to a gradient amplifier which is driven according to a predetermined time function. Each gradient pulse during the read-out sequence consists of a leading edge and a trailing edge, and a constant part therebetween. The leading and trailing edges are generated during the resonant operation of the gradient coil and the constant part is non-resonantly generated by the gradient amplifier.

Such an arrangement is disclosed by European Application 0 227 411. The resonant operation of the gradient coils allows short rise and decay times of the gradient pulses to be achieved. Such short rise and decay times could not otherwise be achieved, or could only be achieved with excessive outlay in the gradient amplifier.

Short switching times of the gradients are necessary, for example, for imaging according to the EPI method, which shall be described briefly below with reference to FIGS. 1 through 7 for explaining the problem to which the subject matter herein is directed. A more detailed description of the EPI method may be found in European Application 0 076 054.

FIGS. 1 through 6 show an example of a pulse sequence employed in the EPI method. The examination subject is simultaneously charged with a radio-frequency excitation pulse RF together with a gradient SS in the z-direction. Nuclear spins in a selected slice of the examination subject are thereby excited. Subsequently, the direction of the gradient SS is inverted, so that the negative portion of gradient SS cancels the dephasing of the nuclear spins caused by the positive portion of the gradient SS.

After the excitation, a phase-coding gradient PC and a read-out gradient RO are generated. There are various possibilities for the shape of these gradients. As a first example, FIG. 3 shows a phase-coding gradient PC which is continuously activated during the read-out phase. As an alternative, FIG. 4 shows a phase-coding gradient PC' consisting of short individual pulses ("blips") which are activated at each polarity change of the read-out gradient RO. Each phase-coding gradient PC and PC' is preceded by a pre-phasing gradient PCV in the negative phase-coding direction. The read-out gradient RO, shown in FIG. 5, has constantly changing polarity, as a result of which the nuclear spins are alternatingly dephased and rephased, so that a sequence of signals S arises, as shown in FIG. 6. In a single excitation, so many signals are acquired that the entire Fourier k-space is scanned, i.e., the existing data are adequate for reconstructing a complete tomogram. An extremely fast switching of the read-out gradient RO with a high amplitude is required for this purpose, which is no able to be achieved with the square-wave pulses which are usually employed in MR imaging. A standard solution to this problem is to operate the gradient coil which generates the read-out gradient RO in a resonant circuit, so that the read-out gradient RO has a sinusoidal shape.

The arising nuclear magnetic resonance signals S are scanned in the time domain, are digitized, and the numerical values acquired in this manner are entered into a raw data matrix. The raw data matrix can be considered as a measured data space, such as a measured data plane in the two-dimensional case shown in the exemplary embodiment. This measured data space is referred to as k-space in nuclear magnetic resonance tomography. The position of the measured data in the k-space is schematically shown in FIG. 7 for a phase-coding gradient PC as shown in FIG. 3, and is schematically shown in FIG. 8 for a phase-coding gradient PC' as shown in FIG. 4. Information about the spacial origin of the signal contributions, which is necessary for imaging, is coded in the phase factors, with the relationship between the locus space (i.e. the image) and the k-space existing mathematically via a two-dimensional Fourier transformation. This is represented by the equation:

$$S(k_x, k_y) = \iint \zeta(x,y) e^{i(k_x x + k_y y)} dx\, dy,$$

for which the following definitions apply:

$$k_x(t) = \gamma \int_0^t (G_x(t'))dt'$$

$$k_y(t) = \gamma \int_0^t (G_y(t'))dt',$$

and wherein $\zeta$ is the nuclear spin density, $\gamma$ is the gyromagnetic ratio, $G_x$ is the value of the read-out gradient RO and $G_y$ is the value of the phase-coding gradient PC (or PC').

Extremely high amplitudes for locus coding of the MR signals are necessary in the EPI method. These high gradient amplitudes must be switched on and off in short time intervals so that the necessary information can be acquired before the nuclear magnetic resonance signal decays. If it is assumed that one millisecond is required for a projection (i.e., for a single signal under a discrete pulse of the read-out gradient RO), then an overall read-out time $T_{acq}$ of 128 ms is needed for a 128×128 image matrix. If conventional square-wave pulses having a duration of $\delta t = 1$ ms were used and a field of view FOV of 40 is assumed, then typical gradient amplitudes $G_R$ of $$G_R = \frac{2}{\gamma \delta t\, \text{FOV}} = 7.5 \text{ mT/m}$$

derive for the read-out pulse RO for square-wave pulses. For trapezoidal pulses having a rise time of $T_{rise}=0.5$ ms and read-out of the signals on the ramps of those pulses, even larger gradient pulses $G_T$ devive as follows:

$$G_T = G_R \frac{T}{T - T_{rise}} = 2 G_R = 15 \text{ mT/m}.$$

As can be seen from the above equations, the demands made on the necessary gradient amplitude are more easier to achieve with shorter rise times. By contrast, the demands made on the switching speed of the gradient amplifier become greater with decreasing rise time. If it is assumed that a current $I_{max}$ is required for achieving the maximum gradient strength $G_{max}$, the voltage U required due to the inductivity L of the gradient coil is calculated as:

$$U = L \frac{dI}{dT}.$$

The ohmic voltage drop across the gradient coil is not yet taken into consideration. For an inductivity of the gradient coil of 1 mH and a maximum current $I_{max}$ of 200 A, the voltage required at the output of the gradient amplifier would assume the following values dependent on the rise time $T_{rise}$ of the gradient current:

| | |
|---|---|
| $T_{rise} = 0.5$ ms | U = 400 V |
| $T_{rise} = 0.25$ ms | U = 500 V |
| $T_{rise} = 0.1$ ms | U = 2,000 V. |

These are demands can only be achieved, without a resonant circuit, by means of a substantial circuit outlay typically by parallel connections and series connections of modular gradient amplifiers.

The problem of achieving shot switching times can be more simply solved by operating the gradient coil in question together with a capacity in a resonant circuit, thereby producing the sinusoidal curve of the read-out gradient RO as shown in FIG. 5. A disadvantage of this approach, however, is that equi-distant sampling in the k-space is not obtained when sampling the signal at chronologically constant intervals. In order to avoid this problem, it is proposed in the aforementioned European Application 0 227 411 only to generate the rising and decaying edges of the gradient pulses by means of the resonant circuit, i.e., only these edges are in sinusoid form, and to provide the gradient pulse with a constant value between these rising and decaying edges. In this approach, however, each of the rise time and decay time occupies one-fourth of the duration of the oscillation in which is contained, which is relatively long.

The principles of generating a gradient pulse in a known manner using a resonant circuit are described in greater detail below with reference to FIGS. 9 through 14.

A series resonant circuit is schematically shown FIG. 9 having a capacitor C and a gradient coil G which is connected via a switch S1 to a gradient amplifier PSU. The series circuit of the switch S1 and the capacitor C is bridged with a further switch S0. Further, the capacitor C is connectable to a charging voltage source $U_{lad}$ via a switch S2. A circuit of this type is disclosed by European Application 0 429 715.

The drive of the series resonant circuit is set forth below for a single, unipolar gradient pulse with reference to the curves shown in FIGS. 10 through 14. FIG. 10 shows the curve of the current $I_G$ through the gradient coil G. FIG. 11 shows the curve of the voltage $U_C$ across the capacitor C. FIG. 12 is a curve of the voltage $U_G$ across the gradient coil G. FIGS. 13 and 14 respectively show the switching states of the switches S0 and S1.

First the capacitor C is charged with the charging voltage source $U_{lad}$ until it has reached the maximum voltage $U_C^{max}$ at a time $t_C$. The energy $E = \frac{1}{2}U \cdot C^2$ is thus stored in the capacitor C. The switch S2 is closed during the charging of the capacitor C. The switch S1 is subsequently opened at a time t0. The series resonant circuit composed of the capacitor C and the gradient coil G thus begins to oscillate, i.e., the current $I_G$ rises with a sinusoidal edge. The voltage $U_C$ across the capacitor C drops to zero at time t1. The switch S0 is now closed. The gradient amplifier PSU thus supplies current via the switch S0 directly to the gradient coil G, and the capacitor C remains discharged. The resonant circuit energy is now stored in the form of current in the gradient coil G. While the capacitor C is discharged, the state of the switch S1 is of no consequence, and is therefore shown shaded in FIG. 14.

The switch S0 is again opened at time t2, and the energy of the gradient coil G is now transferred again into the capacitor C, which charges to a negative voltage to the maximum value $U_C^{max}$. At time t3, all of the energy is again stored in the capacitor C, and the current through the gradient coil G is thus zero. The trailing edge of the gradient current $I_G$ again has the shape of a quarter sine wave.

In the arrangement described above, the rise and decay times (t1−t0 and t3−t2) of the gradient current $I_G$ are defined by one-fourth of the period of a sinusoidal oscillation of the gradient current $I_G$, which is in turn prescribed by the resonant frequency of the series resonant circuit.

SUMMARY OF THE INVENTION

It is an object of the present invention to provide a nuclear magnetic resonance tomography apparatus of the type having at least one gradient coil connected in a series resonant circuit for driving that gradient coil, wherein the rise and decay times of the gradient produced by that gradient coil are shortened in comparison to conventional rise and decay times.

The above object is achieved in accordance with the principles of the present invention in a magnetic resonance tomography apparatus wherein the capacitor in the resonant circuit is charged to a higher voltage before the beginning of a read-out sequence than would be necessary due to produce a pure sine oscillation during the read-out sequence. As a result, the rising and decaying (leading and trailing) edges of the gradient each constitute less than one-fourth of the respective durations between successive zero-axis crossings of the sine oscillation produced by the resonant circuit.

As a result, only the steep parts of the oscillation of the resonant circuit are used for the leading and trailing edges of the gradient, with the less steep (flatter) part of the sine oscillation being cut off. The rising and trailing edges can thus be noticeably shortened, so that a greater range of the constant gradient value is available for signal interpretation, which can be equidistantly scanned (or sampled) in the k-space. A defined gradient area or surface is required in each pulse sequence, which is achieved given short edges with low gradient amplitude.

In a preferred embodiment, the voltage across the capacitor is generated by charging the gradient coil with a current which is higher than that necessary to produce the normally-desired sinusoidal oscillation during a pulse sequence, and the energy represented by this current is then transferred into the capacitor and is stored therein, so that the capacitor is pre-charged at this higher energy value prior to beginning a read-out sequence.

DESCRIPTION OF THE PREFERRED EMBODIMENTS

Figure 1:
FIGS. 1–6 respectively show various signals arising in a conventional EPI sequence.
Figure 2:
Figure 3:
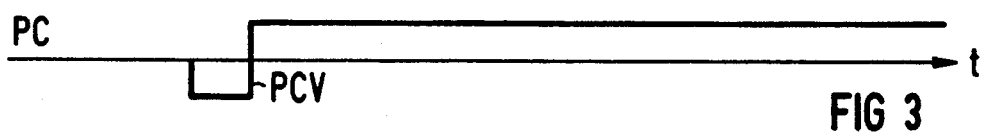
Figure 4:
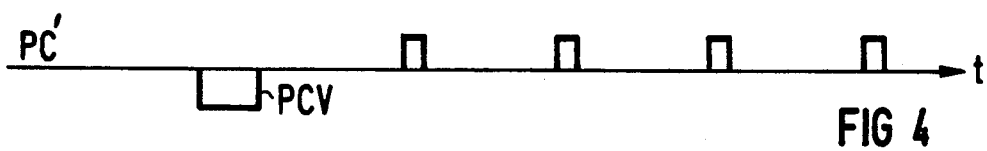
Figure 5:
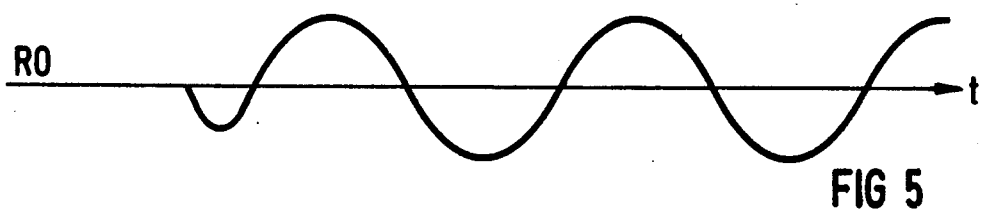
Figure 6:
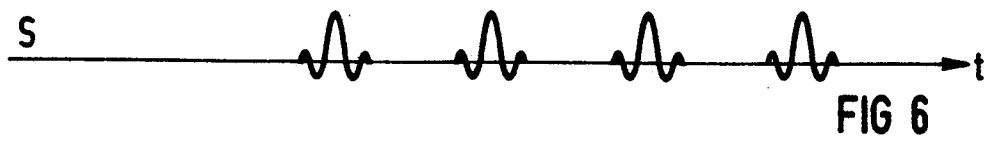
Figure 7:
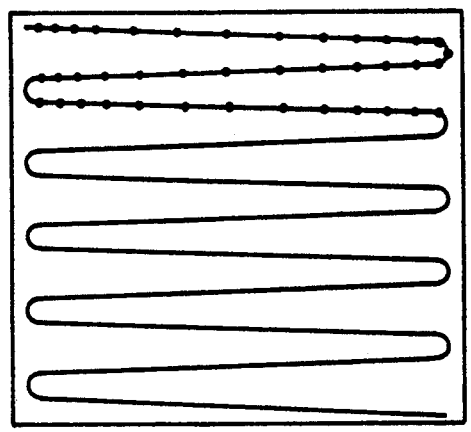
FIG. 7 schematically shows the entry of data points in a raw data matrix using the phase-coding gradient of FIG. 3 in a conventional EPI sequence.
Figure 8:
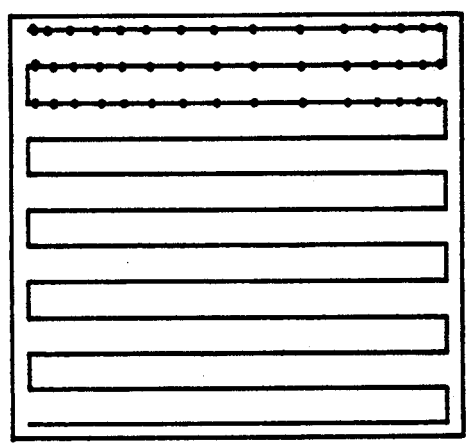
FIG. 8 schematically shows the entry of data points in a raw data matrix using the phase-coding gradient of FIG. 4 in a conventional EPI sequence.
Figure 9:
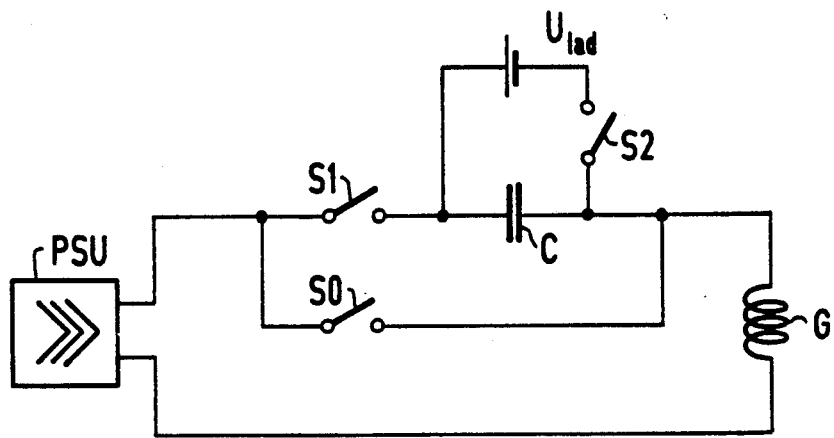
FIG. 9 is a circuit diagram showing a conventional series resonant circuit for operating the gradient coil in an EPI sequence.
Figure 15:
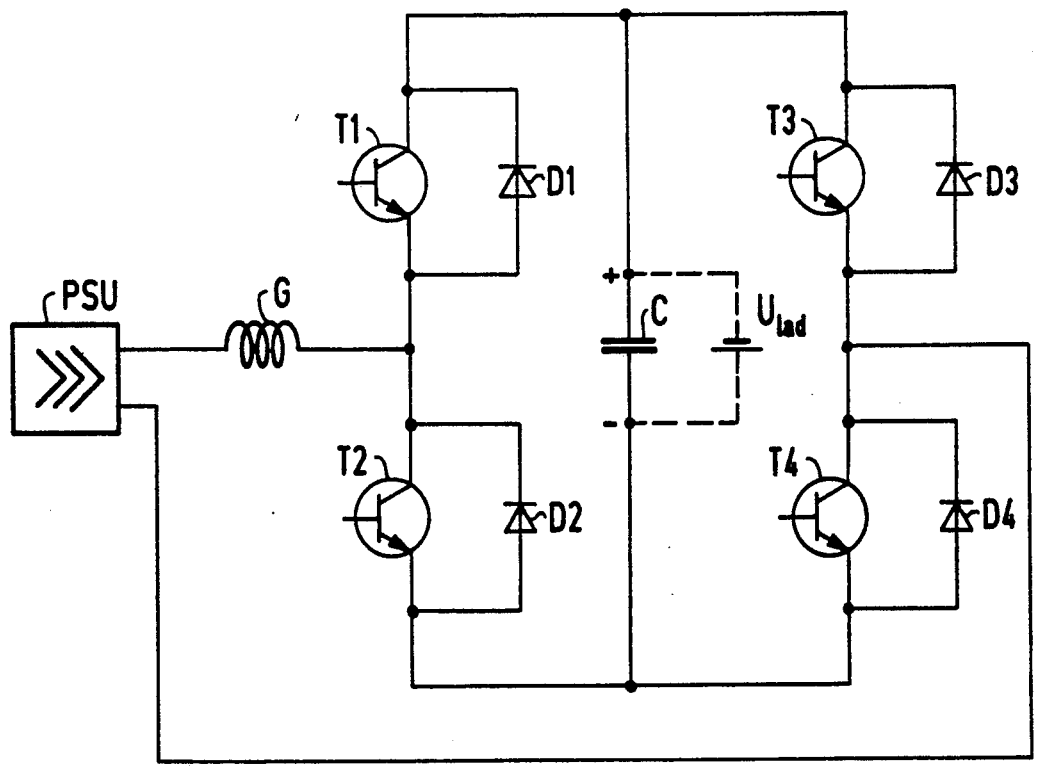
FIG. 15 is a circuit diagram of a series resonant circuit constructed in accordance with the principles of the present invention for operating a gradient coil to produce a gradient with shortened rising and decaying edges.
Figure 10:
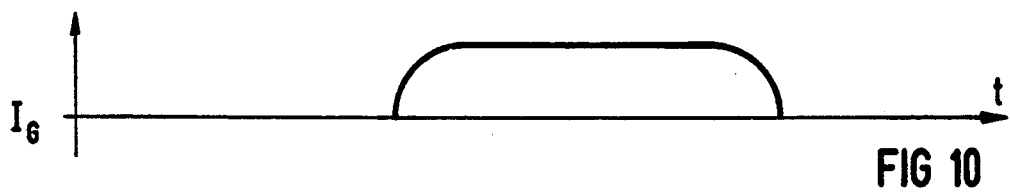
FIGS. 10–14 respectively show various signals arising during the operation of the circuit of FIG. 9.
Figure 11:
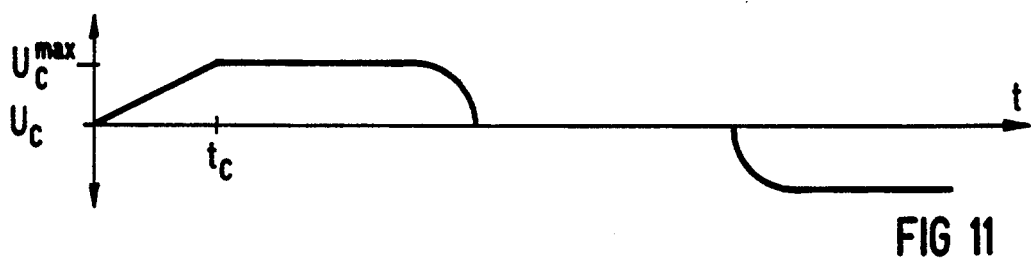
Figure 12:
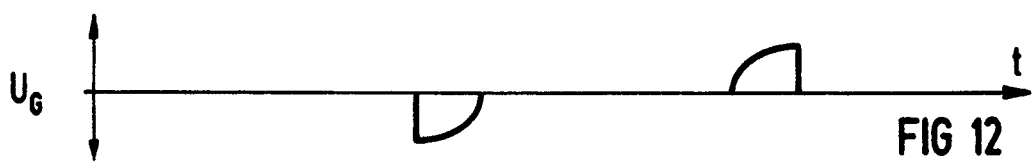
Figure 13:
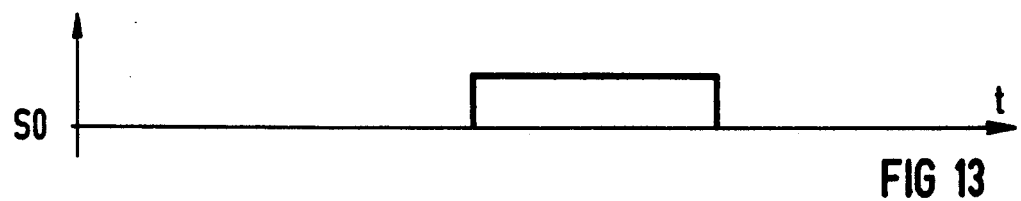
Figure 14:
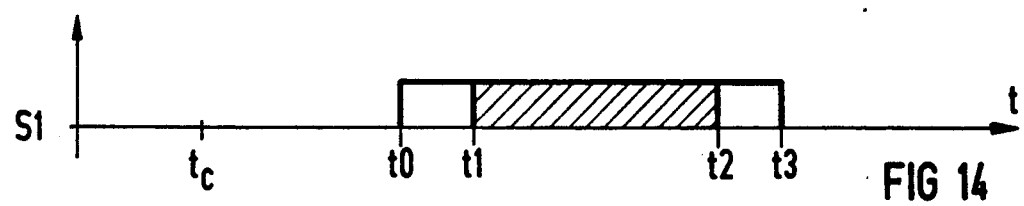
Figure 16:
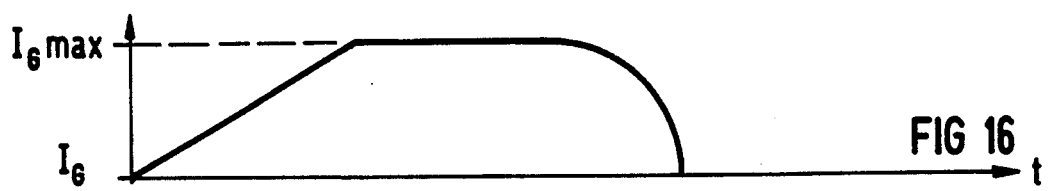
FIGS. 16–33 respectively show various signals arising during the operation of the circuit of FIG. 15, for use in explaining that circuit.
Figure 17:
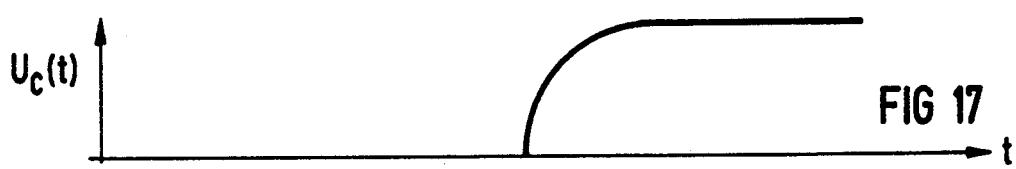
Figure 18:
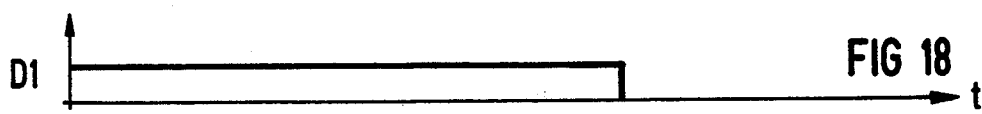

An exemplary embodiment of a circuit for driving a gradient coil G constructed in accordance with the principles of the present invention is shown in FIG. 15. The circuit includes a bridge circuit having four transistors T1, T2, T3 and T4. Each transistor has a respective free-running diode D1, D2, D3 or D4 connected in parallel therewith. One capacitor C is connected in diagonal branch of bridge. The bridge circuit is connected to the gradient amplifier PSU via the gradient coil G.

The capacitor C must first be charged (again) before the beginning of a pulse sequence. This can be undertaken by means of a charging voltage source $U_{lad}$ shown with dashed lines in FIG. 15. As described below with reference to FIGS. 16 through 21, however, charging via the gradient amplifier PSU is also possible. As described in greater detail below, high voltages $U_C^{max}$ are required for achieving especially steep edges. To that end, the maximum current which is used for charging the capacitor C must be set to a value which lies above the value which occurs during the pulse sequence.

Figure 19:
Figure 20:
Figure 21:
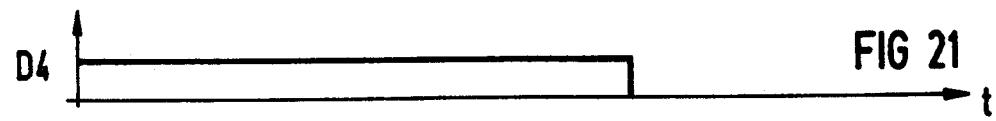

By switching the transistors T2 and T3 on, as indicated in FIGS. 19 and 20, a current $I_G$ is first generated in the gradient coil G. The gradient current $I_G$ is divided and flows across the diode D1, the transistor T3, the transistor T2, and diode D4, as indicated in FIGS. 18 through 21. The capacitor C is thus not charged. The voltage $U_C$ across the capacitor C, shown in FIG. 17, thus initially remains zero. When the transistors T2 and T3 are then driven, the energy stored in the gradient coil G is employed for charging the capacitor C. The current $I_G$ can now flow only through the free-running diodes D1 and D4. The voltage $U_c$ across the capacitor C thus rises. As soon as all of the energy stored in the gradient coil G is transferred into the capacitor C, the capacitor C reaches its maximum voltage $U_C^{max}$, and the current $I_G$ becomes zero, and the free-running diodes D1 and D4 become non-conducting. The capacitor C is thus pre-charged for generating a pulse sequence.

Figure 22:
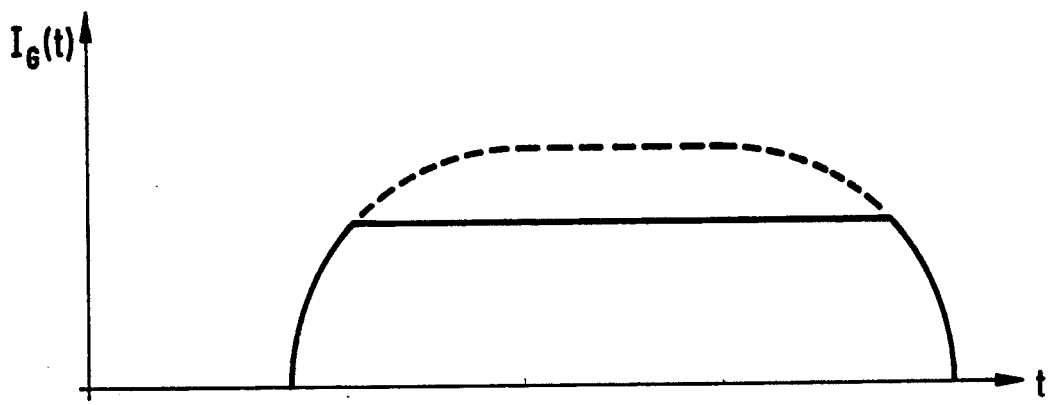
Figure 23:
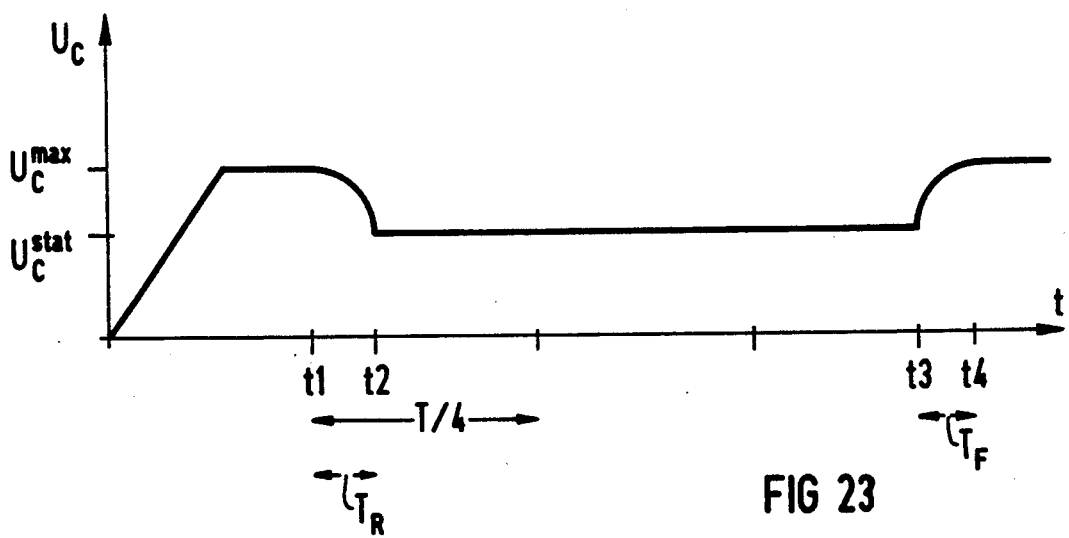

The method employed in the invention for achieving especially steep rising and trailing edges of the gradient current $I_G$ is described below with reference to FIGS. 22 and 23. In conventional series resonant circuits for generating gradient pulses, the capacitor is completely discharged or charged for respectively forming the rising and trailing edges. The current curve $I_G$ shown with dashed lines in FIG. 22 thus results in such conventional systems. As described earlier, the rising and trailing edges each occupy a duration constituting one-fourth of the total period duration T, i.e., each edge has a duration of T/4. The period duration T is defined by the resonant frequency of the resonant circuit.

Figure 24:
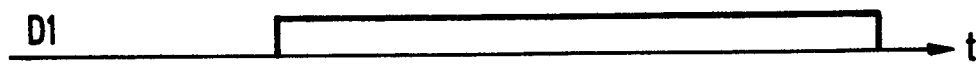
Figure 25:
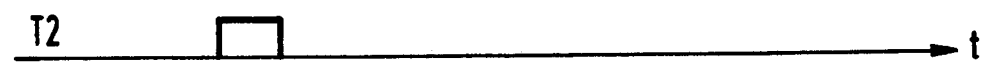
Figure 26:
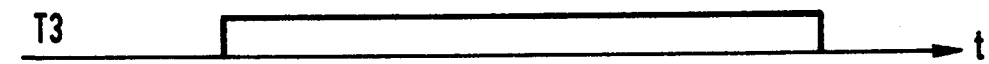
Figure 27:

The inventive concept exploits only the especially steep parts of a sine oscillation in the region of the zero-axis crossing for generating the gradient, and between those steep parts a switch is undertaken to a constant current $I_G$ generated by the gradient amplifier PSU. The less steep parts of the sinusoidal oscillation are thus cut off. This presumes that the capacitor C is first charged with a higher voltage $U_C^{max}$ than would be necessary given utilization of a full sine oscillation in the normal manner. This is shown in FIG. 23. At time t1, the transistors T2 and T3 are activated, as indicated in FIGS. 25 and 26. The capacitor C can then discharge through the gradient coil G. Before the capacitor C is completely discharged, however, i.e., before the voltage $U_C$ has dropped to zero, the transistor T2 is switched to a non-conducting state. Via the free-running diode D1 and the transistor T2, a current now flows through the gradient coil G which is supplied by the gradient amplifier PSU. Because the capacitor C is uncoupled from the circuit in this operating condition, it retains a constant voltage $U_C^{stat}$. At time t3, the trailing edge of the gradient pulse is initiated by switching the transistor T3 to a non-conducting state. Via the free-running diodes D1 and D4, as indicated in FIGS. 24 and 27, the gradient coil G supplies a current through the capacitor C, which is again charged to the maximum voltage $U_C^{max}$.

Only a single gradient pulse is shown in FIGS. 22 through 27. Because the capacitor C is recharged at the end of the pulse, a complete pulse sequence can be correspondingly achieved. As a result of the bridge circuit, moreover, bipolar pulses are also possible.

This is shown below with reference to FIGS. 28 through 33. The switch states of the diodes D1 through D4 are respectively shown shaded in FIGS. 30 through 33. As shown in FIG. 29 (voltage curve across the capacitor C), the capacitor C is first charged to the voltage $U_C^{max}$.

Figure 28:
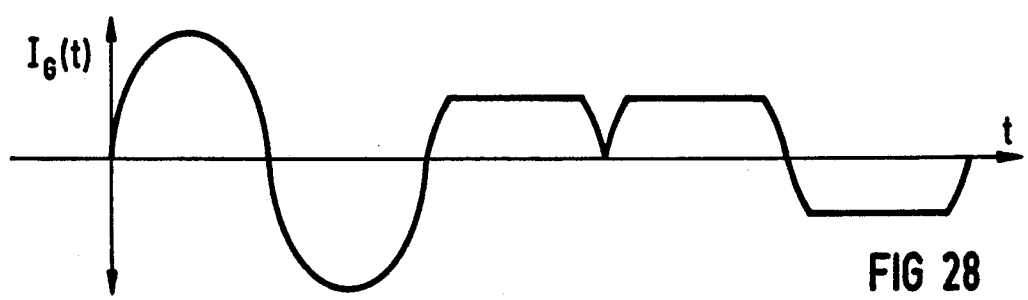
Figure 29:
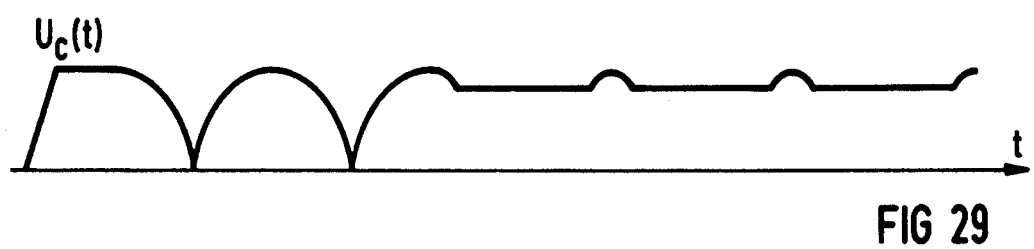
Figure 30:
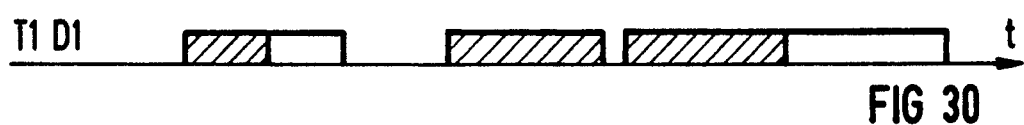
Figure 31:
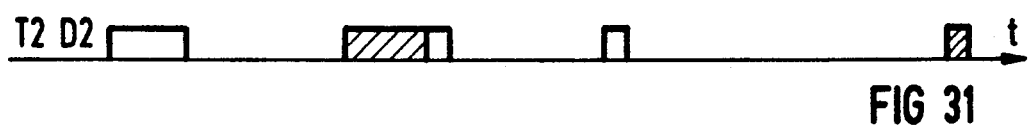
Figure 32:
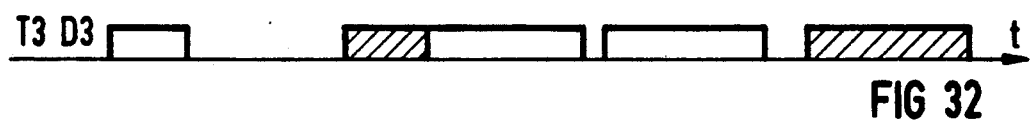
Figure 33:
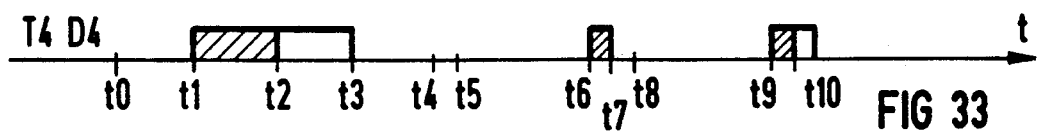

At time t0, the transistors T2 and T3 are made conducting, so that the capacitor C discharges through the gradient coil G, and the current $I_G$ through the gradient coil thus rises, as shown in FIG. 28. In this case, a complete discharge of the capacitor C takes place. As soon as this complete discharge has occurred, all switches are disconnected at time t1, so that the free-running diodes D1 and D4 (as respectively shown in the shaded portions of FIGS. 30 and 33) transmit the current, thereby causing the capacitor C to again be charged to the voltage $U_C^{max}$, and causing the gradient current $I_G$ to drop to zero. A negative gradient pulse is now to be generated. This is achieved by switching the transistors T1 and T4 to a non-conductive state, resulting in a discharge of the capacitor C through the gradient coil G. This time, however, the discharge takes place in the opposite direction. As soon as the voltage across the capacitor C has dropped to zero, the free-running diodes D2 and D3 become conducting, the gradient current $I_G$ drops, and the capacitor C is again charged to the maximum voltage $U_C^{max}$. At time t4, a positive gradient pulse again follows by virtue of the transistors T2 and T3 becoming conducting. The transistor T2, however, was already made non-conducting at time t5 before the voltage $U_C$ across the capacitor C dropped to zero, and thus only the steep part of the resulting sine edge is used. At the time t6, only the transistor T3 is conducting, so that the gradient current $I_G$ across the transistor T3 and through the free-running diode D1 is supplied by the gradient amplifier PSU, and the voltage $U_C$ across the capacitor C remains constant.

At time t6, the transistor T3 becomes non-conducting, so that the gradient coil G again charges the capacitor C to its maximum value $U_C^{max}$ via the free-running diodes D1 and D4.

As shown in the FIGS. 28 through 33, any desired number of further pulses can follow by an appropriate drive of the transistors T1 through T4. Gradient pulses having extremely steep ramps can be generated with the illustrated arrangement with low outlay, because the limitation to one-fourth of a period duration of the resonant circuit is eliminated. The gradient amplifier need not be dimensioned in a manner dictated by the ramps of the gradient pulses, since energy is taken from the capacitor C of the resonant circuit in order to produce those ramps. The rise times are dependent only on the dielectric strength of the gradient coil G, of the capacitor C, of the transistors T1 and T4 and of the diodes D1 through D4. The required, short switching times and high dielectric strengths can be most simply realized with the current state of the art using IBGT-type transistors (insulated gate bipolar transistor).

In conventional systems, no signals are read out during the edges of the gradient pulses, so that the rise and decay times lengthen the echo times. This is of particular disadvantage in fast pulse sequences. The shortening of these parasitic times achieved in accordance with the principles of the present invention can thus be used to advantage not only in the example of the EPI method described above, but also in all other fast sequences.

The bridge configuration shown in the exemplary embodiment of FIG. 15 is particularly economic to construct because it is composed only of unipolar switches.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a nuclear magnetic resonance tomography apparatus operated with a pulse sequence, wherein a read-out sequence follows, per scan, after an excitation of an examination subject, said sequence including the generation of at least two perpendicular gradients via respective gradient coils for location coding of the signals read out in the read-out sequence, means for digitizing said read-out signals and entering the digital signals in a raw data matrix in k-space, means for acquiring an image of said examination subject by at least two-dimensional Fourier transformation of the contents of said raw data matrix, at least one of said gradient coils being connected in a resonant circuit with a capacitance, a gradient amplifier connected to said resonant circuit for driving said at least one gradient coil within said resonant circuit with a time function for resonantly generating rising and trailing edges of a gradient and for non-resonantly generating a constant part of said gradient between said rising and trailing edges, the improvement comprising:

means for shortening the respective durations of said rising and trailing edges by charging said capacitance to a higher voltage before the beginning of a read-out sequence than would be necessary for generating a pure sine oscillation during said read-out sequence for generating a rising edge having a duration which is less than one-fourth of the duration of a sine oscillation preceding its zero crossing and a trailing edge having a duration which is less than one-fourth of the duration of a sine oscillation following said zero crossing.

2. The improvement of claim 1 wherein said means for shortening the respective durations of said rising and trailing edges includes means for charging said gradient coil with a higher current than is necessary for conducting said read-out sequence while maintaining said capacitance uncharged, and for subsequently charging said capacitance by transferring the energy in said gradient coil associated with said higher current into said capacitance.

3. The improvement of claim 1 wherein said resonant circuit consists of said at least one gradient coil and a capacitor, having said capacitance, connected to form a series resonant circuit.

4. The improvement of claim 1 wherein said means for shortening the respective durations of said rising and trailing edges is a bridge circuit having a plurality of bridge arms with a parallel combination of a switch and a diode connected in each bridge arm and having a bridge diagonal with a capacitor, having said capacitance, connected therein, said bridge circuit being connected to a power supply unit via said gradient coil.

* * * * *